United States Patent [19]

Okuno

[11] 4,221,930
[45] Sep. 9, 1980

[54] FM DEFECT COMPENSATION APPARATUS

[75] Inventor: Yoshihiro Okuno, Tokyo, Japan

[73] Assignee: RCA Corporation, New York, N.Y.

[21] Appl. No.: 29,152

[22] Filed: Apr. 11, 1979

[51] Int. Cl.³ .......................... H04S 1/00; H04N 5/76
[52] U.S. Cl. .................................. 179/1 GB; 360/38; 358/8
[58] Field of Search .......... 179/1 GB, 1 G, 100.4 ST, 179/100.4 F; 325/473, 477, 478; 360/38; 358/127, 8

[56] References Cited

U.S. PATENT DOCUMENTS

| | | | |
|---|---|---|---|
| 3,909,518 | 9/1975 | Baker | 360/38 |
| 3,912,858 | 10/1975 | Kenney | 360/38 |
| 3,925,811 | 12/1975 | Kenney | 358/8 |
| 4,119,812 | 10/1978 | Fox | 360/38 |
| 4,158,855 | 6/1979 | Thomas et al. | 360/38 |

OTHER PUBLICATIONS

Phillips Technical Revue, vol. 33 No. 7, pp. 181–185, 1973.

Primary Examiner—Douglas W. Olms
Attorney, Agent, or Firm—E. M. Whitacre; J. S. Tripoli

[57] ABSTRACT

In systems which process frequency modulated carrier waves, such as video disc systems, video tape recorder/playback systems and radio systems, there are occasions where the FM signal suddenly drops to a low level. In the case of FM audio signals, these sudden drops result in objectionable tics and pops in the demodulated audio output. The apparatus described herein reduces these objectionable noises by utilizing a variable impedance in connection with a deemphasis circuit in the main signal path. Upon the occurrence of a signal dropout, a defect indication signal is provided to the variable impedance device. The deemphasis circuit has an overall time constant which includes the variable impedance device and which varies in accordance with the detected signal dropouts so as to provide a substantially smooth demodulated output signal whereby tics and pops, in the output audio signal, are substantially removed.

9 Claims, 11 Drawing Figures

FM DEFECT COMPENSATION APPARATUS

The present invention relates generally to frequency modulated systems and, more particularly, to compensation apparatus for providing corrective action when the FM signal experiences defects.

In the demodulation process in a frequency modulated systems, if the input signal amplitude suddenly drops to either zero or to a low level the demodulated output may be disturbed. This form of input signal defect may be encountered in such systems as video disc systems, video tape recorder systems and FM radios. For example, if dust settles on a video disc record or if the record itself has a defect in the information track, the video disc will cause occasional loss of the recovered FM signal at the pickup device. Similarly, in an FM car radio, a sudden signal drop is observed when a car runs through areas where the signal strength is very low due to cancellation between the direct and reflected transmitted wave. In both cases, these signal defects may be manifested in the audio output as objectionable tics and pops.

In one prior art technique for overcoming objectionable tics and pops in the demodulated output signal of an FM system, the incoming FM signal is analyzed for the occurrence of a signal dropout. The dropout detector provides a pulse having a duration which corresponds to the duration of the signal dropout. This defect pulse is then passed through a pulse stretcher network in order to provide a stretched version of the dropout pulse. This stretched pulse is then utilized to operate a sample and hold network which is located just after the FM demodulator in the audio channel. Upon the generation of the stretched defect pulse the demodulated audio signal is held at the level it had achieved prior to the occurrence of the signal dropout. This level is held for the duration of the stretched pulse. After the occurrence of the stretched pulse, the demodulated audio signal returns to its normal level in the sense that it picks up wherever the demodulated audio signal is at when the stretched pulse disappears.

The prior art solution mentioned above is not completely satisfactory in its operation for the following reason. When the demodulated audio signal level returns to its normal operating level after the occurrence of the stretched pulse, there may very well be a sudden transition between the held audio level and the resumed audio level. In addition, the arrangement also suffers from the fact that a single audio level is being held for the entire duration of the stretched pulse.

The present invention overcomes the previously mentioned disadvantages of the prior art solution by providing a circuit technique which is made integral with the operation of a deemphasis network. The arrangement of the present invention has the tendency to smooth out the transition from the held level to the resumed demodulated audio level in the sample and hold arrangement. In fact, by virtue of the arrangement of the present invention, the signal level during the "hold" period, i.e., during the stretched pulse period, tends to be smoothed out so that the demodulated audio signal wave tends toward a smooth continuous signal wave during the entire duration of the stretched pulse.

In accordance with the present invention, there is provided, in a system for processing a modulated signal wave in at least one main signal path and for providing a demodulated signal to a utilization means, the following combination. A detector means is provided which is responsive to the modulated signal wave for detecting time intervals having substantially diminished levels of the modulated signal and for providing an output signal in response to the occurrence of such time intervals. An impedance means is connected in the main signal path and is responsive to the output signals from the detector means for providing an impedance which varies in accordance with the level of the detector means output signal. A deemphasis circuit is connected between the impedance means and the utilization means. The deemphasis circuit has a frequency response which is determined by a capacitive element and a resistive element. The resistive element of the deemphasis circuit includes a contribution from the variable impedance means. The net effect of the arrangement just described is to provide a deemphasis network which has a time constant that varies in relation to the detection of signal dropouts. This arrangement tends to smooth out the demodulated audio signal during the occasions of signal dropout and thus substantially eliminates the objectionable tics and pops.

In further accordance with the principles of the present invention, it may be desirable in some cases to provide a pulse width discriminator following the dropout detector so that the system for compensation becomes operative only when the dropout duration exceeds a given time period.

Figure 1:
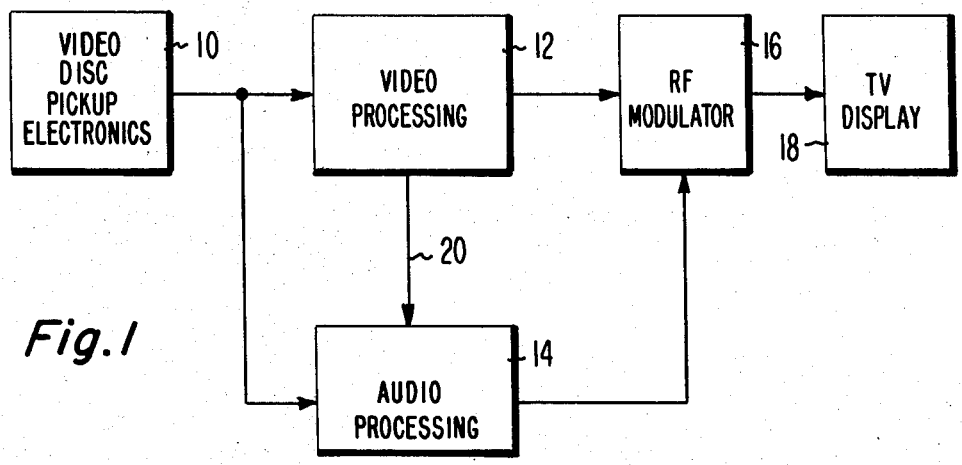
FIG. 1 is a block diagram of a video disc system within which the present invention may be advantageously employed.

FIG. 1 illustrates in block diagram form a typical video disc system. The video disc pickup electronics 10 recovers the video and audio information from the disc record and provides an FM signal to the video processing unit 12 and to the audio processing unit 14. The signal provided at the output of the video disc pickup electronics 10 is typically a composite FM signal containing luminance, chrominance and audio information as well as synchronizing components.

The video processing unit 12 typically comprises the electronics for preparing the received FM signal for modulation in the RF modulator 16 in preparation for coupling to the TV display 18. The video processing unit 12 will include a video FM demodulator and typically will also include some form of defect detector or dropout detector. In systems of the type shown in FIG. 1, the term "signal dropout" means more than simply zero or low level signals. Generally it refers to conditions where the incoming FM carrier frequency falls above or below the desired deviation range. Thus, the means for providing a dropout detector in systems such as video disc playback systems may comprise the loss of carrier function as well as excursions outside the desired deviation range of the FM signal. These units analyze the incoming FM signal and provide a pulse output whenever a loss of signal or substantial drop in signal is encountered. The duration of the dropout detector pulse is made to coincide with the duration of the dropout in the incoming FM signal. In FIG. 1 the connection between the video processing unit 12 and the audio processing unit 14, designated as line 20, represents the connection between the dropout detector in the video processing unit 12 and the audio processing unit 14. Line 20 is the conductive path which will carry the pulse generated by the defect detector.

The audio processing unit 14 responds to the incoming FM signal and processes that signal along a signal path which will typically include after appropriate filtering an FM demodulator and will couple the demodulated audio signal to the RF modulator 16 in preparation for the delivery of a suitable composite signal i.e., video with accompanying audio plus synchronization components, to the TV display 18. There will, of course, be applications where the audio system includes provision for stereophonic signals. That is, there will be in stero (or even bilinqual) applications, provision within the audio processing unit 14 for two signal paths, each having an FM demodulator for providing left (first) and right (second) signals to a utilization device.

Figure 2:
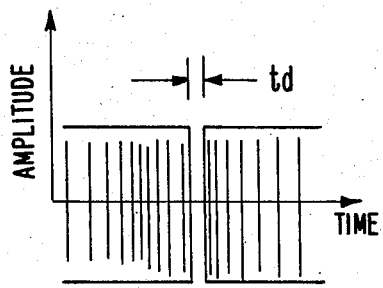
FIGS. 2 through 5 are waveform diagrams helpful in explaining the operation of the present invention.

Referring now to FIG. 2, an ideal FM carrier is illustrated. It will be noted that at some time during the recovery of the FM signal, there is a time period, td, wherein the FM carrier has been completely lost. The time td represents the duration of the signal defect. As shown in FIG. 2, the duration of the signal defect is much shorter than the modulating wave period and much longer than the carrier wave period. This is typically the case in such systems as those under consideration.

Figure 3:
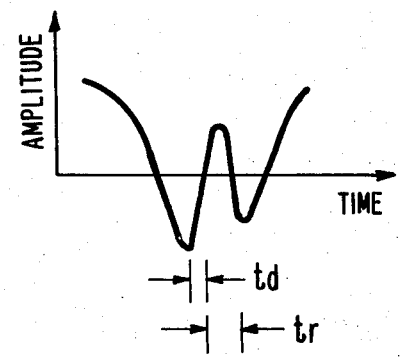

Referring to FIG. 3, the result of the signal defect shown in FIG. 2 as it relates to the demodulated signal in FIG. 3 is illustrated. FIG. 3 shows that a transient occurs in the demodulated signal which extends for a time period tr beyond the signal dropout time period td. It is exactly this transient phenomena which makes it desirable to extend the duration of the defect pulse so as to cover the entire duration of td plus tr. This is accomplished, as will be more fully discussed herein, through the utilization of the pulse stretching circuit which follows the dropout detector.

Figure 4:
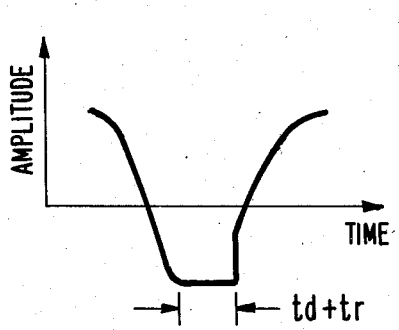

Assuming a compensation system, which is based on sample and hold techniques, it will now be seen as illustrated in FIG. 4, that the demodulated audio level is held at the amplitude level just prior to the occurrence of a signal dropout for a time period comprising td plus tr. At the conclusion of the stretch pulse period, td plus tr, the sample and hold circuitry is released and the demodulated audio signal returns to the level where it normally would be at this point in time. The net result, as shown in FIG. 4, with the use of the typical sample and hold technique, is that the demodulated audio signal is flat for the hold time and then experiences a sharp transition from the hold level to the resumed point on the demodulated audio signal wave.

Figure 5:
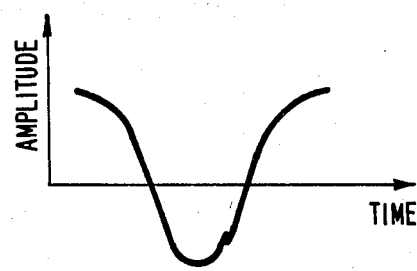

Although the main cause of the objectionable tics and pops in the demodulated audio output, i.e., the transient response shown in FIG. 3, is reasonably overcome through the use of sample and hold techniques as shown in FIG. 4, the sample and hold technique is not completely satisfactory as a result of the held level and the sudden change from the held level to the resumed level. It would be much more desirable to achieve the demodulated audio output signal as shown in FIG. 5 wherein the held level is not truly held but rather fills in the signal wave during the period td plus tr and wherein the sudden shift in level at the conclusion of that period is substantially smoothed out. The arrangement shown in FIG. 6 will provide substantially the kind of response illustrated in FIG. 5.

Figure 6:
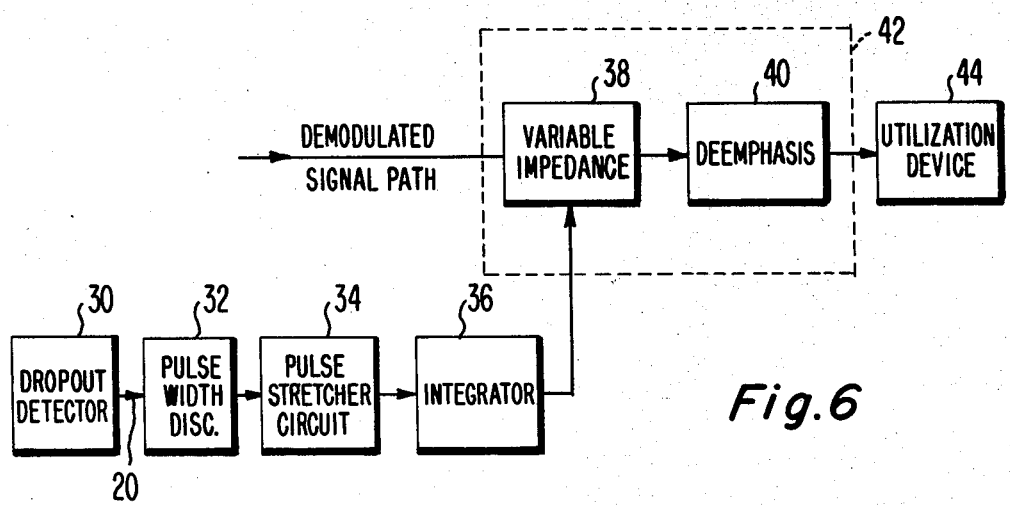
FIG. 6 is a block diagram illustrating one embodiment of the compensation apparatus of the present invention.

Referring now to FIG. 6, there is shown the dropout detector 30 which, as previously mentioned, is typically located within the video processing unit 12 in FIG. 1. Dropout detector 30 provides a pulse indication of the occurrence of a loss or diminshed level of the carrier on line 20. The dropout indication pulse on line 20 is provided to a pulse width discriminator 32. The pulse width discriminator 32 is not entirely necessary in the operation of the present invention. However, it has been determined that in certain systems it may be undersirable to activate corrective action upon the occassion of very short signal dropouts. Thus, pulse width discriminator 32 is employed to prevent activation of the compensating scheme when the pulse width of the dropout detector pulse on line 20 has a duration of less than a given value. The pulse signal output from discriminator 32 (when the dropout detector pulse has a duration greater than the given value) is then provided to a pulse stretcher circuit 34. Pulse stretcher 34 is utilized to provide the function of stretching the discriminated dropout detector pulse to a length sufficient to cover the anticipated transient response as shown in FIG. 3. This stretched version of the dropout pulse from the pulse stretcher circuit 34 is then provided at the input terminal of the integrator circuit 36.

Integrator circuit 36 is utilized so that it will provide an output signal which has a DC voltage level component which varies in accordance with the defect count and the accumulated duration of the pulses which are provided at the input terminal of integrator 36. Thus, integrator circuit 36 provides a signal which has a varying level dependent upon the duration of the defect pulses as well as the frequency of occurrence of the defect pulses.

The output signals from integrator circuit 36 are then provided to a variable impedance device 38 which is connected to a deemphasis circuit 40. As will become clearer herein, the variable impedance device 38 may be thought of as being part of the deemphasis circuit 40. However, for purposes of discussion, and since variable impedance device 38 in the embodiment under consideration does comprise a separate physical entity from the traditional deemphasis circuit 40, the two elements are shown separately in FIG. 6. This composite circuit 42 is interposed in the main audio signal path which processes the incoming FM signal through the demodulation process and provides the demodulated audio signal to a utilization device 44. The arrangement shown in FIG. 6 is such that as the level of the output signal from integrator 36 increases in response to longer defects or rapidly recurring defects, the impedance of the variable impedance device increases. However, as noted before, the variable impedance device also forms part of the deemphasis circuit which, as will be shown herein, comprises a resistive element in the main signal path and a capacitive element connected between the main signal path and a point of reference potential. Therefore, the variable impedance device has an effect upon the time constant of this composite circuit 42. It is this effect upon the overall deemphasis time constant which causes the demodulated audio signal to take on the characteristics as described in reference to FIG. 5.

Figure 7:
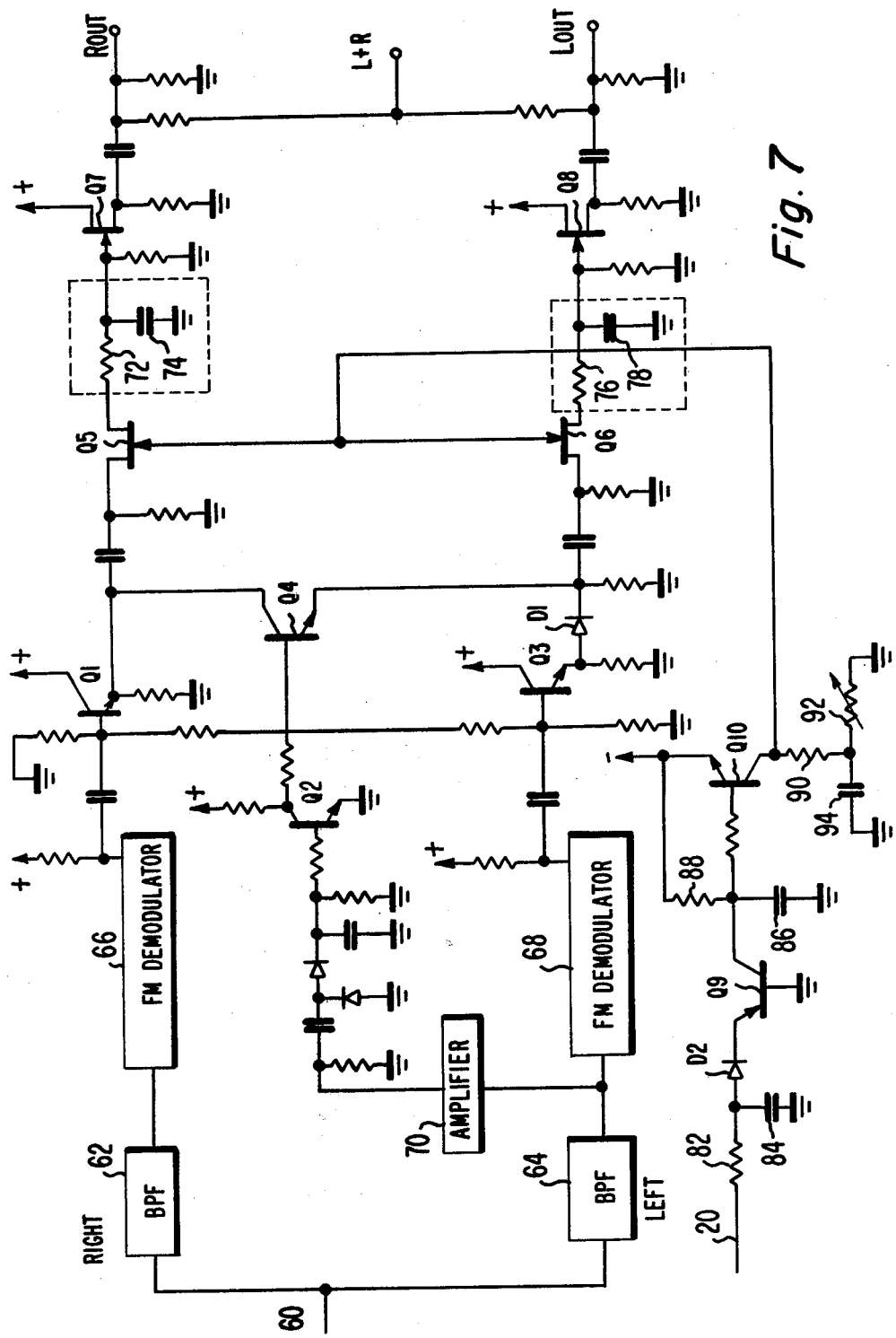
FIG. 7 is a detailed diagram demonstrating a practical system utilizing the principles of the present invention.

FIG. 7 shows an application of the principles of the present invention to a video disc system and more particularly to the audio processing circuitry of a video disc player. In the arrangement shown in FIG. 7, there are two main processing channels, one for the right channel and one for the left channel in a stereophonic arrangement. In other systems, the two channels could represent bilinqual audio accompaniement to the video information recorded on the disc. In FIG. 7, the FM signal recovered from the disc is provided on line 60. This signal is coupled to the right channel band pass filter 62 which passes frequencies on the order of 716 KHz. Similarly, the FM signal on line 60 is coupled to a second band pass filter 64, for the left channel, and this filter passes signals in a band around the frequency of 905 KHz. The signals from band pass filter 62 are then coupled to an FM demodulator 66 which may be of the phase locked loop form. The right channel demodulated audio signal is then coupled to a buffer stage including transistor Q1. In the left channel, the signals from band pass filter 64 are coupled to an FM demodulator 68 which may also be of the phase locked loop type. The signals from demodulator 68 are then coupled to a buffer stage including transistor Q3.

An amplifier 70 has an input terminal connected to a point between band pass filter 64 and the FM demodulator 68. The signals from amplifier 70 are coupled through to transistor Q2 which has an output signal taken from its collector terminal and coupled to the base of transistor Q4. When the incoming FM signal on line 60 includes a 905 KHz component, as would be the case in a stereo record, transistor Q2 is turned on and transistor Q4 is cut off. When transistor Q4 is cut off, the diode D1 is turned on to provide right and left outputs at the corresponding terminals R out and L out. On the other hand, if there is no 905 KHz component in the incoming FM carrier, as in the case of monaural record, transistor Q2 is cut off while transistor Q4 is turned on. In this condition, diode D1 is turned off and the demodulated output at the emitter terminal of transistor Q1 appears at both the R out and L out terminals.

Transistor Q5, which may be an FET transistor or an MOS transistor, has its main electrodes connected in the right signal path. Similarly, transistor Q6, which would be of a type similar to transistor Q5, has its main electrodes connected in the left audio signal path coming from the emitter electrode of transistor Q3. Transistors Q5 and Q6 are operated such that the impedance as measured between the main electrodes thereof is a function of the bias supplied to the respective gate electrodes. Thus, transistor Q5 forms the variable impedance element for the right channel and transistor Q6 forms the variable impedance element in the left channel.

A deemphasis network comprising resistor 72 and capacitor 74 is coupled to one main electrode of transistor Q5 in the right channel path. Similarly, resistor 76 and capacitor 78 form a traditional deemphasis circuit in the left channel and this deemphasis circuit is connected to the one main electrode of transistor Q6. Transistor Q7, in the right channel, has its gate electrode connected to the junction between resistor 72 and capacitor 74. Transistor Q7 is part of a high input impedance buffer stage. Similarly, transistor Q8, in the left channel, has its gate electrode connected to the junction point between resistor 76 and capacitor 78. Transistor Q8 is part of a high input impedance buffer stage.

In the playback of stereophonic or bilinqual records, signals would appear at the R out terminal and the L out terminal. In the case of monaural records, as previously described, the signals would be combined to provide a single output at the terminal marked L+R.

The circuitry for developing the control signals for varying the impedance of devices Q5 and Q6 is also shown in FIG. 7. The defect pulse from a dropout detector is provided on line 20. The defect or dropout pulse is first provided to the integrating circuit comprising resistor 82 and capacitor 84. This integrating circuit in combination with diode D2 provides a pulse width discriminator circuit. When the duration of the defect pulse on line 20 is short, the voltage across capacitor 84 does not increase to a level which enables diode D2 to turn on. As a result of diode D2 being cut off, the transistor Q9 is also held in a cut off condition. With no output signal at the collector electrode of transistor Q9, the transistor Q10 is also held off. When the duration of the incoming pulse on line 20 is sufficiently long, the voltage across capacitor 84 increases up to a point where diode D2 and transistor Q9 are turned on. As a result of transistor Q9 being turned on, the capacitor 86, which is connected between the collector terminal of transistor Q9 and a point of reference potential, namely ground, is permitted to discharge. In the arrangement shown in FIG. 7, resistor 88 and capacitor 86 form the pulse stretching network. That is, the pulse lengthening is achieved by charging capacitor 86 through resistor 88 from the supply voltage and the subsequent discharge of capacitor 86. Therefore, the resulting pulse width is determined by the time constant formed by reistor 88 and capacitor 86, i.e. at the conclusion of the discriminated pulse, the discharge of capacitor 86 lengthens the pulse signal applied to the base electrode of transistor Q10.

Transistor Q10 serves as the output stage for the pulse modification network just described. Resistor 90 in the collector circuit of transistor Q10 serves as the main load for this transistor while the integrator circuit comprising variable resistance device 92 and capacitor 94 serves to produce an average DC voltage related to the duration of the incoming defect pulses and the freqency of those pulses. Transistor Q10 is selected for its capability of driving the variable impedance devices Q5 and Q6. As shown in FIG. 7, the signals appearing at the collector terminal of the transistor Q10, as modified by the integrator circuit comprising variable resistor 92 and capacitor 94, are coupled to a junction point common to the gate electrode of transistors Q5 and Q6.

As described, the circuitry in FIG. 7 does not respond to short duration defect pulses by virtue of the operation of the pulse width discriminator comprising resistor 82 and capacitor 84 in combination with diode D2. With a value of 2.2K ohms for resistor 82 and a value of 4,700 picofarads for capacitor 84, the circuit as shown will start to operate for defect pulses having a duration of more than 5 microseconds. Also in the circuit shown in FIG. 7, when resistor 88 has a value of 12K ohms and capacitor 86 has a value of 4,700 picofarads and when the combination is coupled to a −5 V supply voltage, the defect pulses having a duration of more than 5 microseconds have their pulse width lengthened by 50 microseconds. This 50 microsecond wide pulse is generally sufficient to cover the more common occurrences of signal dropouts along with the transients which are associated with those dropouts in the demodulated signal.

Looking back to the main demodulated audio signal paths, when the resistor 72 has a value of 15K ohms and the capacitor 74 has a value of 4,700 picofarads, the time constant of the right channel deemphasis circuit is on the other of 70 microseconds. Similarly, in the left channel the deemphasis circuit comprising resistor 76 and capacitor 78 provides a time constant of approximately 70 microseconds.

In the operation of the circuits shown in FIG. 7, the variable impedance device formed by transistors Q5 and Q6 are selected to have a resistance value which will vary between several hundred ohms to more than one Meg-ohm. Thus, it is possible to change the effective deemphasis time constant of the circuit by changing the bias voltage supplied to the gate electrodes of these devices. By way of example, if the applied voltage to the gate electrode of transistor Q5 causes the variable impedance device to achieve a resistance value equal to the resistance of resistor 72, then the effective time constant of the deemphasis circuitry in the right channel is doubled. The increase of the time constant decreases the higher cutoff frequency of the channel which will result in an improvement of signal-to-noise ratio at the sacrifice of high fidelity.

Figure 8:
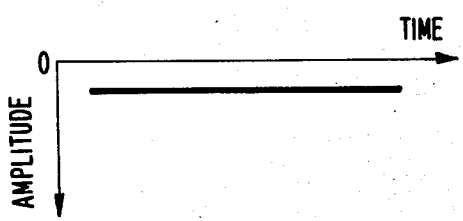
FIGS. 8–11 are waveform diagrams useful in explaining the operation of FIG. 7.
Figure 9:
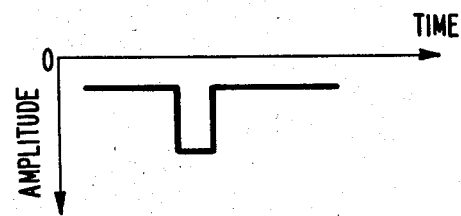
Figure 10:
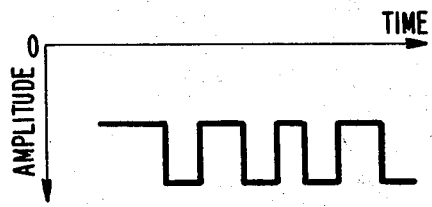

Referring now to the graphs in FIGS. 8, 9 and 10, it will be seen that for extremely small defects, there appears only a slight negative voltage level appearing at the collector terminal of transistor Q10, which is the signal coupled to the gate electrodes of transistors Q5 and Q6. Referring now to FIG. 9, we see the waveform at the collector of transistor Q10 when a pulse, having a duration greater than the limits set by the pulse width discriminator, appears on the incoming line. That is, the incoming pulse results in the output pulse on the collector of transistor Q10 sitting on a slight DC voltage level. Going further now to FIG. 10, where the effect of rapidly recurring defect pulses on the signal provided at the collector of transistor Q10 is shown, it is noted, in particular, how the DC level has changed as a result of the increased number of defect pulses and also the duration of those pulses. This phenomenon, of course, is directly related to the operation of the integrator circuit comprising variable resistor 92 and capacitor 94 in the collector circuit of transistor Q10. The resistor 92 may be varied so that proper DC levels are supplied to the gate electrodes of transistors Q5 and Q6 so as to achieve the desired impedance level of those devices for particular defect conditions.

Figure 11:
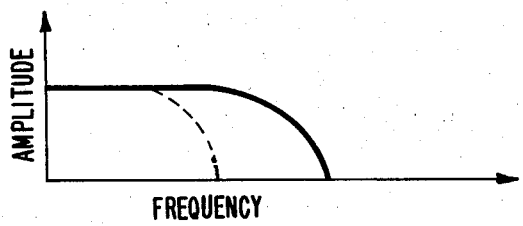

Referring now to FIG. 11, the frequency response of one of the deemphasis networks is shown. The solid line represents the frequency response of a deemphasis circuit when there is a small defect count on the incoming FM signal. The dotted line represents the frequency response for a large defect count. The graph in FIG. 11 is used to illustrate how the variable deemphasis network changes in frequency response to effectuate the processing of the demodulated audio signal along the lines shown in the graph of FIG. 5. Again, it is noted that the smoothing process, as depicted in FIG. 5, is achieved at the cost of high fidelity. However, elimination of tics and pops in the audio output is, in most systems, more important than the temporary loss of high fidelity during loss of carrier time periods.

I claim:

1. In a system for processing a modulated signal wave in at least one main signal path and for providing a demodulated signal to a utilization means, the combination comprising:
   detector means responsive to said modulated signal wave for detecting time intervals having substantially diminished levels of said modulated signal and for providing an output signal in response to the occurrence of such time intervals;
   impedance means connected in said main signal path and responsive to said detector means output signal for providing an impedance which varies in accordance with the level of said detector means output signal; and
   a deemphasis circuit connected between said impedance means and said utilization means, said deemphasis circuit having a frequency response determined by a capacitive element and a resistive element including said variable impedance.

2. The combination according to claim 1 wherein said impedance means comprises a transistor having two main electrodes connected in said at least one main signal path and a control electrode coupled to said detector means.

3. The combination according to claim 2 wherein said detector means provides a pulse output signal and said detector means further comprises means for extending the duration of said detector means output pulse signal beyond the duration of said time intervals.

4. In a system for processing a frequency modulated signal wave in at least one main signal path and for providing a demodulated signal to a utilization means, the combination comprising:
   a signal dropout detector responsive to said frequency modulated signal wave for detecting time intervals having substantially diminished levels of said frequency modulated signal wave and for providing a pulse signal corresponding in time to the occurrence of said time intervals;
   a pulse modification means responsive to said dropout detector pulse signal for providing an output pulse signal having a duration greater than said dropout detector pulse signal;
   circuit means connected in said at least one main signal path, said circuit means comprising a variable impedance means connected to a deemphasis circuit including a capacitive element and a fixed resistive element, the impedance of said variable impedance element being controlled by said modification means output pulse signal, said circuit means being operated to vary the frequency response of said deemphasis circuit to thereby provide a frequency response which provides a substantially smooth demodulated signal to said utilization means during times corresponding to the occurrence of said pulse modification means output signal.

5. The combination according to claim 4 wherein said pulse modification means further comprises a pulse width discriminator responsive to said signal dropout detector whereby said modification means pulse signal is provided only when said dropout detector pulse signal has a time duration greater than a specified time period.

6. The combination according to claim 7 wherein said pulse modification means further comprises a signal integrator for providing a D.C. level with said modification means pulse signal, said D.C. level being related to the number of dropout detector pulses, said integrator being connected to said variable impedance means.

7. In a system for processing a frequency modulated signal wave including video information content and audio information content, said audio information being processed along at least one main signal path for providing at least one demodulated audio signal to a utilization means, said frequency modulated signal wave being subject to time intervals having substantially diminished levels, the combination comprising:

- a signal dropout detector responsive to said frequency modulated signal wave for detecting said time intervals and for providing a pulse signal having pulse durations corresponding to said time intervals;
- a pulse width discriminator responsive to said dropout detector pulses for providing a discriminator pulse output signal only when said detector pulse signals have time durations greater than a specified time period;
- pulse stretcher means responsive to said discriminator output pulses for providing output pulse signals having time durations greater by a given amount than said discriminator output pulse signals;
- an integrator means responsive to said pulse stretcher means output signals for providing an output signal comprising pulses and a D.C. level which varies in accordance with the frequency and time duration of the pulses provided from said pulse stretcher means;
- circuit means connected in said at least one main audio signal path, said circuit means comprising a variable impedance means having two main electrodes connected in said at least one main audio signal path and a control electrode, the impedance of said variable impedance means being controlled by the application of signals to said control electrode, said circuit means further comprising a deemphasis circuit including a capacitive element and a fixed resistive element, the impedance of said variable impedance means being controlled by said integrator means output signal coupled to said control electrode, said circuit means being operated to provide a frequency response which provides a substantially smooth demodulated audio signal to said utilization means during times corresponding to the occurrence of said pulse stretcher means output signals.

8. The combination according to claim 7 further comprising a second audio signal path responsive to said frequency modulated signal wave for providing a second demodulated audio signal wave to said utilization means, said second audio signal path having a second circuit means comprising a second variable impedance means having two main electrodes connected in said second audio signal path and a control electrode, the impedance of said second variable impedance means being controlled by the application of signals to said second impedance means control electrode, said second circuit means further comprising a second deemphasis circuit including a second capacitive element and a second fixed resistive element, the impedance of said second variable impedance means being controlled by the integrator means output signals coupled to said second variable impedance means control electrode, said second circuit means being operated to provide a frequency response in said second audio signal path which provides a substantially smooth second demodulated audio signal to said utilization means during times corresponding to the occurrence of said pulse stretcher means output signals.

9. The combination according to claim 8 wherein said frequency modulated signal includes audio information modulated on a first carrier wave and audio information modulated on a second carrier wave and wherein said first modulated carrier wave is processed in said at least one main audio signal path and wherein said second modulated carrier wave is processed in said second audio signal path.

* * * * *